United States Patent [19]

Davidson et al.

[11] Patent Number: 5,181,167
[45] Date of Patent: Jan. 19, 1993

[54] STACKING HEATPIPE FOR THREE DIMENSIONAL ELECTRONIC PACKAGING

[75] Inventors: Howard L. Davidson, San Carlos; Satyanarayana Nishtala, Santa Clara, both of Calif.

[73] Assignee: Sun Microsystems, Inc., Mountain View, Calif.

[21] Appl. No.: 801,672

[22] Filed: Dec. 2, 1991

[51] Int. Cl.$^5$ .............................................. H05K 7/20
[52] U.S. Cl. .................................. 361/385; 361/382; 361/386; 361/388; 361/396; 174/16.3; 174/15.2; 62/418; 165/80.3; 257/715
[58] Field of Search ............... 361/382, 385, 386, 387, 361/388, 389, 396; 165/80.3, 104.33; 174/15.2, 16.3; 357/79, 81, 82; 62/418

[56] References Cited

U.S. PATENT DOCUMENTS

| | | | |
|---|---|---|---|
| 4,631,636 | 12/1986 | Andrews | 361/385 |
| 4,841,355 | 6/1989 | Parks | 357/82 |
| 5,053,856 | 10/1991 | Davidson | 357/82 |

Primary Examiner—Leo P. Picard
Assistant Examiner—Young S. Whang
Attorney, Agent, or Firm—Blakely Sokoloff Taylor & Zafman

[57] ABSTRACT

Heatpipe elements having a thin flat, rectangular geometry are contstructed according to known heatpipe techniques. An electronic circuit module incorporating multiple discrete and integrated circuit elements is integrally imbedded into a recessed top exterior surface of each heatpipe element. The heatpipe elements are longer in one dimension that the circuit modules imbedded therein, the excess length being partitioned equally on each side of a circuit module. The remaining opposing edges of each circuit module equally overhanging the lateral edges of the heatpipe are configured as area array connectors. The resultant heatpipe/circuit module forms bilateral thermal contact areas for thermally contacting complementary surfaces of immediately adjoining heatpipe/circuit modules. Circuit modules electrically contact preceding and succeeding circuit modules via stacking connectors interposed between the respective area array connectors. The thermal and electrical contact areas of each heatpipe/circuit module permit multiple heatpipe/circuit modules to be vertically stacked upon themselves permitting compact complex electronic systems producing moderate heat fluxes to be conveniently field-assembled and disassembled in any order consistent with the electronic systems' logic scheme, without necessitating special tools or demounting of liquid cooling connections.

17 Claims, 3 Drawing Sheets

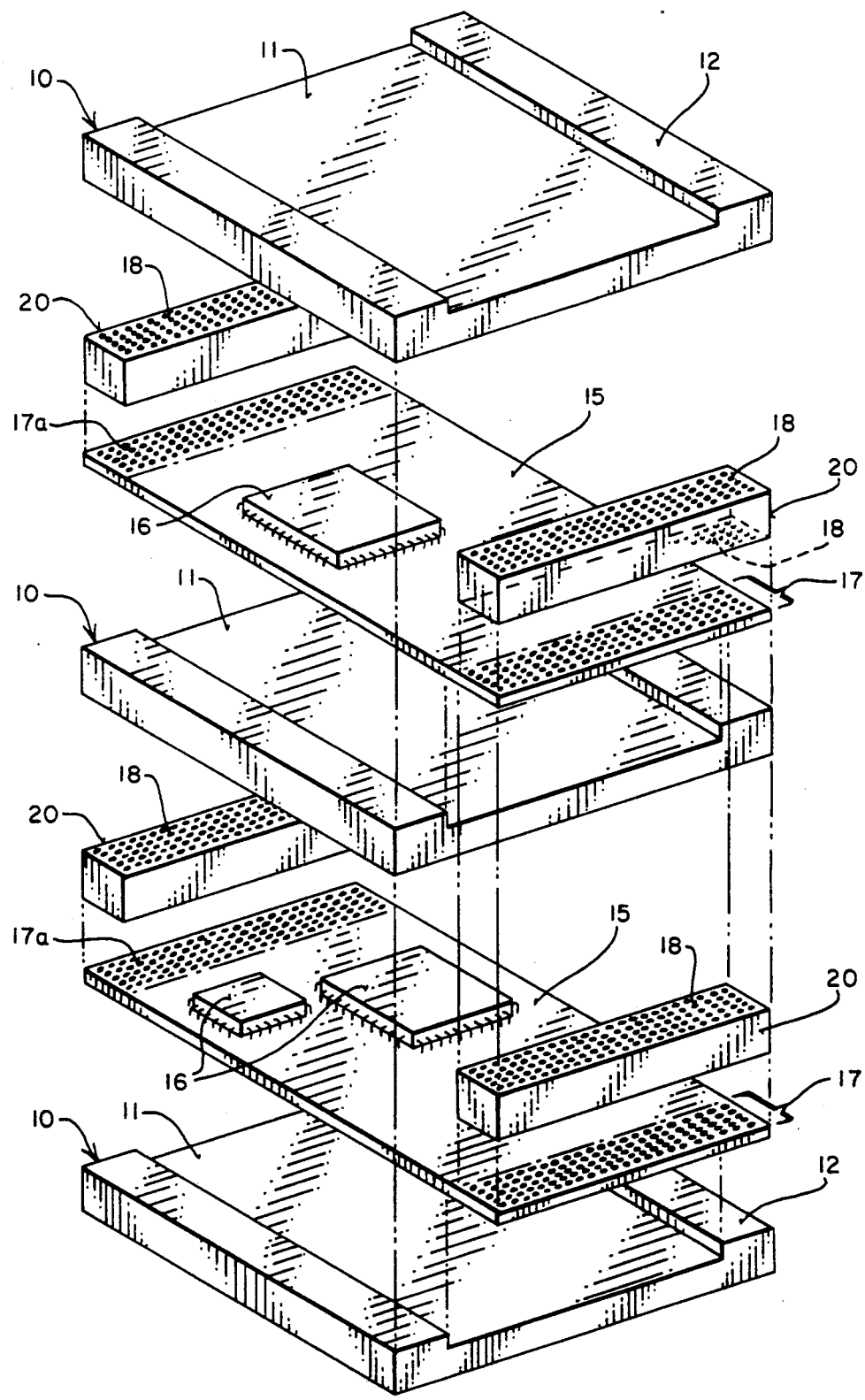
FIG_1

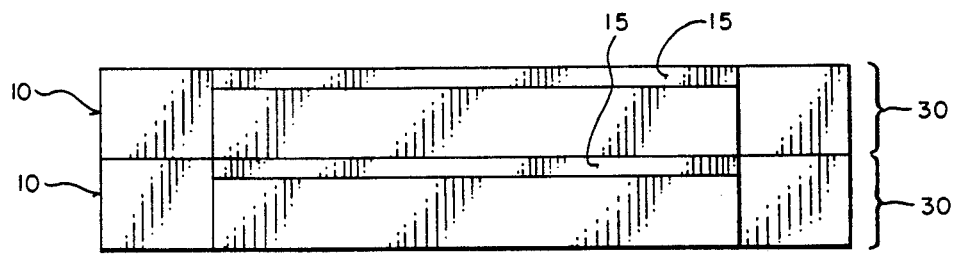
FIG_2
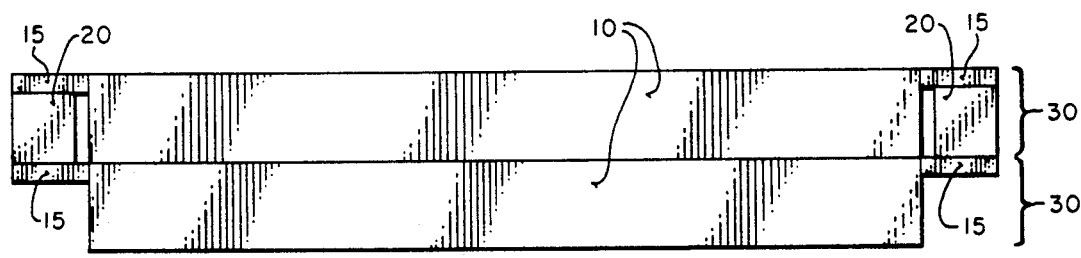
FIG_3
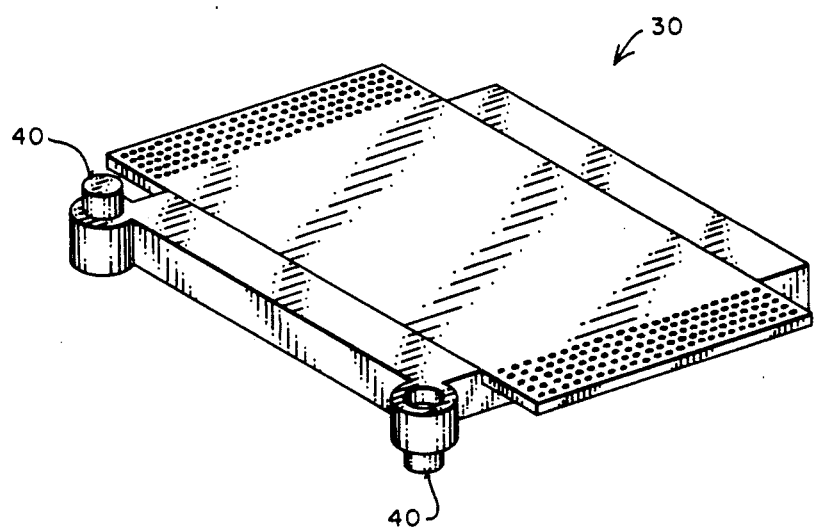
FIG_4

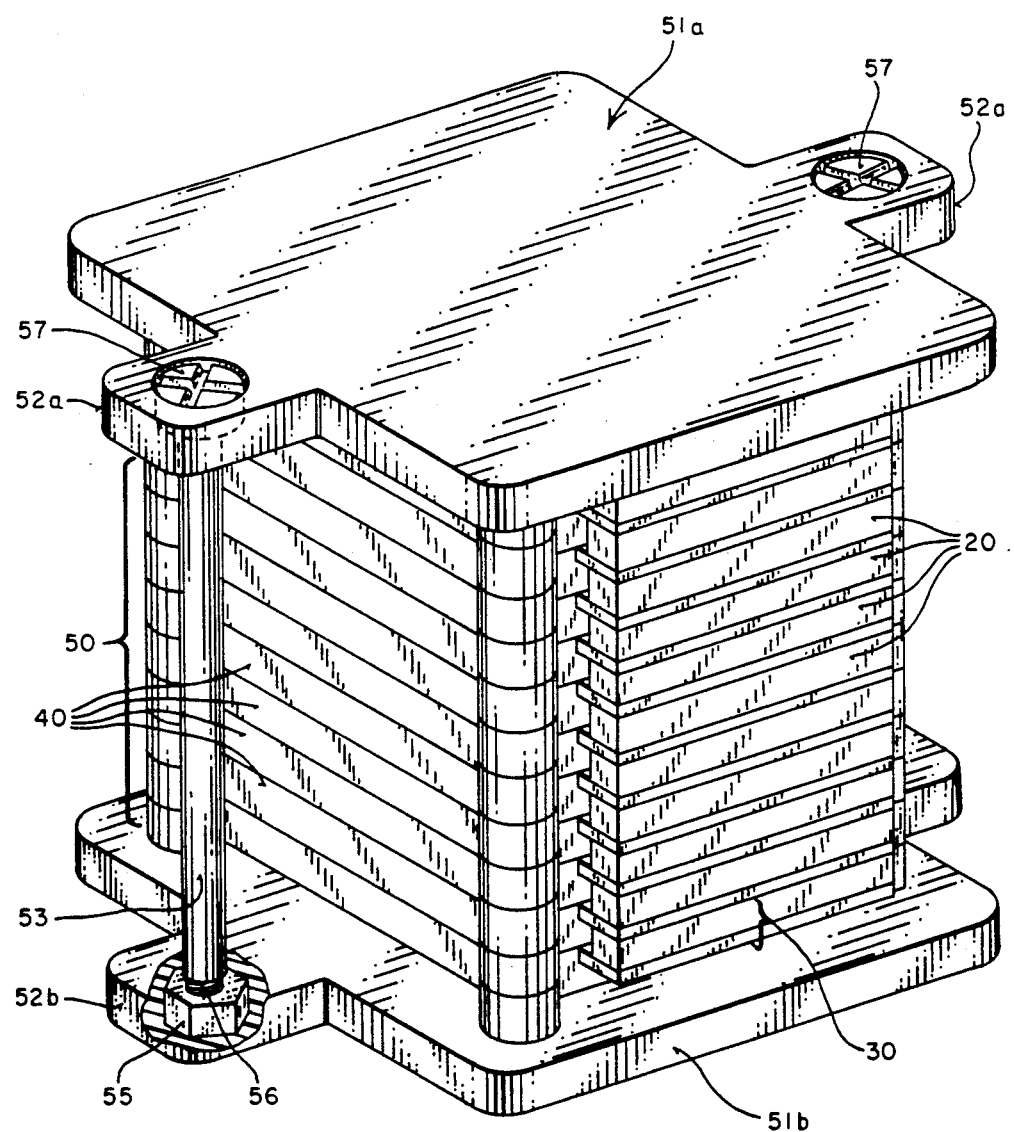

STACKING HEATPIPE FOR THREE DIMENSIONAL ELECTRONIC PACKAGING

BACKGROUND OF THE INVENTION

1. Field of the Invention

The present invention relates to cooling devices, and more particularly to high efficiency cooling devices applied to compact three-dimensional electronic and computation systems.

2. Art Background

In recent years, electronic systems generally, and computers in particular, have become physical smaller, while at the same time becoming computationally more powerful. Typically, powerful computers have many high speed processor and memory chips to efficiently handle large amounts of data or intensive numerical computation. The high speed processor and memory chips in turn require substantial current to operate as intended. A natural consequence of high current chips is that significant heat is produced as the chips function, which heat must be removed from the computer so that the chips function properly and the physical integrity of the computer is not compromised.

For low-power chips in the range 3-5 watts, forced air convection cooling methods may be effectively employed, wherein ambient air is passed over circuit elements and modules. Frequently, heatsinks in the nature of copper or aluminum are attached to the bottoms of chips or circuit boards to first draw heat away from the chip, and then transfer the heat into the convective air stream. A representative example of a convectively cooled compact computer arrangement is disclosed in U.S. patent application Ser. No. 07/553,521 entitled "Three Dimensional Packaging Arrangement for Computer Systems and the Like", filed Jul. 13, 1990.

Conversely, for high-powered applications, for example chips consuming from 50-100 watts, closed or open loop liquid cooling systems are well known and frequently used, wherein a working fluid is passed between circuit elements and subsequently circulated to a remote heat exchanger wherein the absorbed heat is removed, after which the fluid is recirculated to the circuit modules of the computer. Exemplary techniques for liquid cooling of high-powered compact computer systems are disclosed in the prior filed U.S. patent applications; Ser. No. 07/553,541 entitled "Apparatus for Cooling Compact Arrays of Electronic Circuitry", filed Jul. 15, 1990, and U.S. Pat. No. 5,053,856 to Davidson entitled "Apparatus for Providing Electrical Conduits in Compact Arrays of Electronic Circuitry Utilizing Cooling Devices". Lapinsky, U.S. Pat. No. 5,005,640 discloses a thin multipassage liquid cooling arrangement producing surface temperatures isothermal to within 1° C. However, the arrangement taught by Lapinsky depends upon recirculating a liquid coolant through the passage to cool each cooler, and does not contemplate use of modular sealed working fluid heatpipes to avoid the added complexity of liquid recirculation. Sutrina, U.S. Pat. No. 4,631,573 discloses a stacking interposed arrangement of liquid cooled heat sinks providing high thermal efficiency. Sutrina is principally directed to providing cooling for stacked electrical components, e.g., power transistors, while permitting such components to operate at different electrical potentials, the arrangement of Sutrina providing electrical insulation between stacked components. However, the disclosure of Sutrina is dependent upon external liquid recirculation facility, and does not encompass detachable cooling/electrical modules. For very high-powered computer chips, recirculated liquid cooling, and even cryogenic cooling, are the only effective methods for removing heat from the computer.

For intermediate-power computer chips in the range 5-50 watts, it is feasible and even desirable to employ cooling methods which do not require liquid cooling with its accompanying complexity and bulk. Prior art methods for removing moderate amounts of heat include attaching heatsinks to heatproducing circuit elements, wherein the heatsinks may include sealed liquids to increase the thermal mass of the heatsink. More recently, heatpipes have been developed wherein a high vapor pressure liquid is sealed in a thin-walled thermally conductive element. One surface of the heatpipe element draws heat away from the surface contacting the heat producing body, e.g., a circuit element, and transfers it to the sealed working fluid. The working fluid is caused to locally boil, the vapor rapidly moving away from the heated region through passages in the heatpipe to cooler regions of the heatpipe. Capillary action in an applied wick returns the condensed working fluid to the region heated. A fundamental feature of a heatpipe is that the entire external surface of the heatpipe contacting a particular heat producing body can be maintained to within 1° C. for reasonable power densities. The isothermal characteristic of heatpipes is of particular interest to solid state instrumentation or computation electronics, where device junction temperatures must be maintained within relatively narrow temperature ranges, and wherein temperature differences between chips on one circuit module must not vary significantly.

Although heatpipes have been previously used to cool computer and electronic systems, no previous methods or apparatus have effectively addressed cooling requirements of extremely compact general purpose computer systems, for example, a computer measuring 4×4×1 inches, and wherein circuit boards are spaced as little as 0.1 inch apart. Three-dimensional stacked electronic systems have been developed in connection with military electronic applications. For example, combat instrumentation systems or computation systems which must operate either remotely or autonomously and within a compact space have been constructed, wherein multiple circuit boards or modules are layered upon one another, separated by a material having a high heat capacity and heat of fusion. For example, in missle guidance computers, multiple electronic modules are packed together with paraffin, typically requiring 250 joules per gram of energy to melt, thus absorbing a significant amount of heat prior to the onset of deformation and melting. Such paraffin-packed computer systems are intended for extremely short lifetimes, and in military systems may not exceed five minutes. Although limited lifetime computers are appropriate for missile guidance systems which are destroyed upon impact, a five minute lifetime is essentially worthless in industrial or commercial applications.

As will be described in the following paragraphs, the present invention discloses methods and apparatus for effectively cooling a compact assembly of multiple chip electronic circuit modules containing moderate power chips without need for liquid cooling elements or interconnects. Moreover, the present invention permits integrated heatpipe/electronic circuit modules to be vertically stacked in any order consistent with the particular electronic system's logic scheme, and which permits heat to be removed from either the top or bottom of the resulting stack at the user's convenience.

SUMMARY OF THE INVENTION

Methods and apparatus for stacking integrated heatpipe/electronic circuit modules with application to three-dimensional electronic packaging producing moderate heat flux are disclosed. Heatpipe elements having a thin flat, rectangular geometry are constructed according to known heatpipe techniques, wherein a thermal wick is applied to an interior surface of each hollow heatpipe element, a high vapor pressure working fluid introduced into the heatpipe, and the heatpipe subsequently evacuated and sealed. The exterior surface forming the top of each heatpipe element is recessed to receive an integrally imbedded circuit module incorporating multiple discrete and integrated circuit elements. The heatpipe elements are longer in one dimension than the circuit modules imbedded therein, enabling the excess length to be partitioned equally on each side of a circuit module. The excess heatpipe immediately beneath the circuit module. The additional thickness permits multiple heatpipe cooling elements to be stacked vertically upon one another, the top and bottom surfaces of the thicker portions intimately contacting, respectively, the bottom and top surfaces of the preceding and suceeding heatpipe elements.

The remaining opposing edges of each heatpipe element are dimensionally shorter than the imbedded circuit module, each edge of the circuit module equally overhanging the lateral edges of the heatpipe. The overhanging portions of the circuit modules are configured as area array connectors, with circuit modules electrically contacting preceding and succeeding modules via stacking connectors interposed between the respective area array connectors.

The stacking electrical integrated heatpipe/circuit elements permit complex, compact electronic systems (e.g., computer systems) and the like having moderate heat removal requirements to be conveniently field-assembled and disassembled in any order consistent with the electronic systems' logic scheme, without necessitating special tools or demounting of liquid cooling connections.

BRIEF DESCRIPTION OF THE DRAWINGS

The objects, features and advantages of the present invention will be apparent from the following description of the invention in which:

FIG. 1 is an exploded perspective view of two heatpipe/electronic circuit modules stacked upon each other.

FIG. 2 illustrates a front elevation view of two stacked integrated heatpipe/electronic circuit modules.

FIG. 3 illustrates a right side elevation view of the stacked heatpipe/electronic circuit module shown in FIG. 2.

FIG. 4 is a perspective view of a keyed heatpipe/electronic circuit module.

FIG. 5 is a perspective view of a stacked system of heatpipe/electronic modules restrained by mechanical clamping plates.

DETAILED DESCRIPTION OF THE INVENTION

Methods and apparatus for stacking integrated heatpipe/electronic circuit modules for use with intermediate power density three-dimensional electronic packaging are disclosed. In the following detailed description of the preferred embodiment, for purposes of explanation, specific numbers, power densities, heat transfer coefficients, etc., are set forth in order to provide a thorough understanding of the present invention. However, it will be apparent to one skilled in the art that the present invention may be practiced without the specific details. In other instances, well known devices are shown in block diagram form in order not to obscure the present invention unnecessarily.

An exemplary embodiment of the present invention is illustrated in FIG. 1. In FIG. 1, an exploded view illustration of two heatpipe/electronic circuit modules is shown, wherein heatpipes 10 each have a recessed area 11 appropriately sized to receive an electronic circuit module 15. Heatpipes 10 are constructed according to any of several known methods of producing heatpipes. In the preferred embodiment of the present invention, heatpipes 10 are hollow thin-walled bodies of thin, rectangular geometry, having a thermal wick (not shown) applied to the interior surface of heatpipe 10 corresponding to the exterior surface featuring recessed area 11. The thermal wick may be sintered, flame-sprayed, or otherwise deposited upon the interior surface of heatpipe 10 as is generally known. An inert working fluid, for example water, is then introduced into heatpipe 10, whereafter heatpipe 10 is evacuated and subsequently hermetically sealed. Thus made, heatpipe 10 can maintain a nearly isothermal exterior temperature, because the working fluid contained within heatpipe 10 is very near its boiling point, even at moderate room temperature. Whenever heat is applied to heatpipe 10, even locally, the working fluid contained within heatpipe 10 is caused to boil wherein the working fluid is locally converted into the gas phase. The gas phase working fluid molecules then rapidly stream away from the heated area through small internal passageways (not shown) under capillary action, and condense on cooler surfaces away from the localized heating, thereby transmitting the thermal energy from the heated area to the cooler area. Thus, heat produced from a localized heating phenomenon e.g., an integrated circuit, in contact with a small portion of the heatpipe is rapidly and efficiently distributed throughout the heatpipe element, where the heat may then be further conducted or convected away. For more detailed information on heatpipe and heat transfer technology, the reader is referred to Dunn and Reay, *Heat Pipes*, Pergamon (1982).

As shown in FIG. 1, each heatpipe element 10 is recessed in both horizontal dimensions so as to conformally receive electronic circuit module 15 formed of a substrate to which are bonded discrete or integrated electronic circuit elements 16. The substrate portion of electronic circuit module 15 may be of any appropriate circuit substrate material. However, in the presently preferred embodiment, because the present application envisions moderately high power densities generated upon the circuit module, electronic circuit module 15 typically would be fabricated of aluminium oxide or aluminium nitride ceramics. Any number of electronic circuit elements 16 may be bonded or otherwise attached to electronic circuit module 15, and subsequently interconnected with other electronic circuit elements (not shown) via conductive traces (not shown) applied to the substrate. In the preferred embodiment, it is anticipated that electronic circuit module 15 typically will be a memory expansion module or processor module which, when added to other similar modules, together comprise an operational computer or other fully functional electronic system. Electronic circuit module 15 further has on opposing edges area array connectors 17 formed in a known manner of a large number of individual metallized contacts 17a in a small mesh electrical grid (e.g., 0.040 in×0.040 in), wherein electrical signals may be coupled into or from electronic circuit module 15. Using contacts 17a as an electrical grid, very high density area array connectors 17 may be formed on electronic circuit module 15, frequently exceeding 1,000 signals per edge. However, other electrical contact arrangements are possible, including use of edge connectors coupled to a backplane.

Electronic circuit module 15 is then intimately joined to heatpipe 10 within recessed area 11, the attachment means being of any several well known methods for joining ceramic to metallic cooling elements, including glue. The principle constraint of the means for attachment is that excellent thermal transfer characteristics must be supported by the attachment mechanism. Therefore, glue must be thermally conductive glue, and crimping methods must provide sufficient heat transfer surfaces and conduction paths from the electronic circuit module 15 to heatpipe 10. For purposes of interconnecting electronic circuit module 15 with preceeding and subsequent electronic circuit modules, stacking connectors 20 which are interposed between area array connectors 17 of electronic circuit module 15 and the immediately prior or succeeding circuit module. Stacking connectors 20 incorporate area array connectors 18 to complement area array connectors 17, and are formed in such a way as to individually preserve all electrical signals sourced by and transmitted to electronic circuit module 15. Commercially available examples of stacking connectors 20 would include connectors manufactured by Cinch and Augat.

Reference is now made to FIG. 2. Having bonded electronic circuit module 15 to heatpipe 10, and by placing stacking connectors 20 on area array connectors 17, the combination of heatpipe 10, electronic circuit module 15, and stacking connectors 20 may be considered to form a heatpipe/electronic module 30, wherein heatpipe/electronic module 30 may be stacked upon itself in essentially unlimited fashion. In order to achieve a sufficiently good thermal interface between successively stacked heatpipe/electronic modules 30, an appropriate thermal transmission medium is applied to both lateral surfaces 12, extending beyond electronic circuit module 15, as embedded in heatpipe 10. Exemplary methods of providing good thermal interfaces include applying thermally conductive grease, lapping surfaces 12 of heatpipe 10 to optical flatness, or inserting thin boron nitride filled elastomer sheets between successive stacked heatpipe/electronic modules 30. Thereafter, stacked heatpipe/electronic modules 30 are clamped or otherwise urged together to make mechanical and electrical contact, as is more particularly described below in connection with FIG. 5. It is important to note that the dimensions of laterally extending surfaces 12 to either side of the electronic circuit module 15 determine the thermal impedance of the stacked electronic system. Further, by controlling the thermal impedance at end each interface, the thermal gradient existing vertically in an assembled electronic system or computer may be controlled to any desired magnitude. That is, because each thermal interface in an assembled stack sustains a thermal loss which is a function of surface area, temperature, and poor power density if the electronic system produces X watts per square centimeter, the thermal gradient between heatpipe/electronic modules 30 may be reduced in half by doubling the surface area of lateral surfaces 12 of heatpipe 10.

Referring briefly to FIG. 3, a right side elevational view of two successive stacked heatpipe/electronic modules 30 is shown.

Although not required for the purposes of the present invention, it is desirable that each heatpipe/electronic circuit module 30 be fitted with or otherwise equipped with a "keying" feature. With reference to FIG. 4, a heatpipe/electronic module 30 is shown with a simple device to ensure that heatpipe/electronic module 30 may be assembled into an electronic system or computer in only one way. That is, the "keying" feature 40 as shown in FIG. 4 ensures that heatpipe/electronic module 30 is aligned properly with respect to other heatpipe/electronic modules 30 within the total electronic system. This is especially true when forming a functional computer system, wherein particular electronic circuit modules 15 may consist of memory boards, whereas other electronic circuit modules 15 may consist of processor boards, I/O boards, graphics boards, etc. In the case of memory boards, it is desirable that consecutive memory boards may communicate with one another and identify themselves to one another in order to form a contiguous block of memory with shortest possible datapaths between adjacent electronic circuit modules 15 forming the computer memory. Thus, it is desirable that any "keying" feature 40 employed for purposes of the present invention incorporate facility not only for preserving proper physical orientation of a particular heatpipe/electronic module 30 with a stacked system, but also for preserving sequential ordering of modules 30 within the aforesaid system.

It is further intended that the heatpipe/electronic modules 30 also incorporate the attributes of above-referenced patent application Ser. No. 07/553,439, entitled "Apparatus for Providing Addresses for Three-Dimensional Packages Arrangements for Computer System", wherein the addressing scheme discriminates between identical modules within a stack, thereby preserving unique orderings of heatpipe/electronic modules 30 within a stacked computer system. Successive modules 30 within a stacked computer system would basically align and configure themselves according to the addressing scheme disclosed in the above-referenced patent, which is incorporated herein by reference. Accordingly, a computer system or other electronic system may be formed of "smart" heatpipe/electronic modules 30 wherein particular modules would identify themselves to previous or subsequent modules, and would request or be assigned appropriate address space as necessary.

Reference is now made to FIG. 5. After the required number of heatpipe/electric modules 30 have been stacked together according to the requirements of the particular systems, the modules 30 must be securely fastened together to make mechanical (i.e., thermal) and electrical contact. Although any of an arbitrary number of various fastening mechanisms may be employed, an exemplary clamping arrangement is shown in FIG. 5 for illustrative purposes. In FIG. 5, flat clamping plates 51a and 51b are placed, respectively, above and below the assembled computer stack 50. Plates 51a and 51b each have areas allocated to receive and locate a terminal end of a restraining member. As shown in FIG. 5, plates 51a and 51b may be configured with tabs 52a and 52b drilled to receive elongated bolts 57. Bolts 57 having threaded portions 56 are received and secured by conventional hex nuts 55 recessed into tabs 52b of lower plate 51b. Accordingly, as bolts 57 are threaded into nuts 55, all heatpipe/electronic modules 30 in computer stack 50 will be urged together, making secure mechanical and electrical contact. Terminal electrical connections may be made to clamped computer stack 50 in any known manner. Heat sourced by modules 30 within computer stack 50 may be conducted away from either top plate 51a or bottom plate 51b, at the designer's option, according to system design constraints.

Thus, an extremely compact yet powerful electronic or computer system may be constructed, wherein electronic circuit modules producing moderate (i.e., up to approximately 50 watts), heat fluxes are used, no external liquid cooling facilities are required with the present invention. Moreover, the present invention contemplates and facilitates field serviceability of any computer system so assembled by providing easy-to-use modules combining electrical and heat transfer attributes.

I claim:

1. In a compact electronic system having a plurality of electronic circuit modules including a multiplicity of electronic circuit elements, a cooling apparatus comprising:
   a plurality of self contained substantially isothermal heatpipes;
   each heatpipe integrally receiving at least one of said electronic circuit modules, said heatpipes and electronic circuit modules when integrated forming a plurality of heatpipe/electronic modules;
   connector means coupled to said electronic circuit modules for electrically interconnecting said electronic circuit modules; and,
   framework means connected to said plurality of heatpipe/electronic modules for maintaining said heatpipe/electronic modules in mechanical and electrical contact, said framework means allowing said heatpipe/electronic modules to be successively stacked wherein each of said heatpipe/electronic modules vertically touches an adjacent heatpipe/electronic module to form said compact electronic system.

2. The cooling apparatus as set forth in claim 1, wherein said heatpipes further comprise thin-walled hollow bodied containing high vapor pressure liquid.

3. The cooling apparatus as set forth in claim 2, wherein said heatpipes further comprise:
   substantially rectangular plates having top, bottom, front and back surfaces, said rectangular plates further having a substantially centrally located recessed portion on the top surface thereof, said recessed portion extending in a first dimension to said front and back surfaces of said rectangular plate, said recessed portion conformally receiving said electronic circuit module in a second dimension, said electronic circuit modules extending beyond said front and back surfaces in said first dimension, and said bottom surface comprising a bottom heat transfer interface; and
   a pair of lateral surfaces comprising lateral heat transfer interfaces on said top surface abutting said recessed portion and symmetrically extending away therefrom in said second dimension in a plane substantially parallel with said recessed portion, said lateral heat transfer interfaces extending in said first dimension between said front and back surfaces of said plate.

4. The cooling apparatus as set forth in claim 1, wherein said electronic circuit modules further comprise glazed ceramic chip carriers.

5. The cooling apparatus as set forth in claim 1, wherein said connector means comprises:
   at least one high density multiple signal connector coupled to each of said electronic circuit modules, said high density multiple signal connectors further coupled to said electronic circuit elements mounted to each electronic circuit module; and
   at least one stacking connector interposed between said high density multiple signal connectors of adjacent electronic circuit modules; said stacking connector receiving and transmitting control and data signals between adjacent electronic circuit modules.

6. The cooling apparatus as set forth in claim 1, wherein said framework means comprises:
   a first clamping plate positioned below a first heatpipe/electronic module;
   a second clamping plate positioned above a final heatpipe/electronic module;
   compression means connected to and extending between said first and second clamping plates for urging said plates together.

7. The cooling apparatus as set forth in claim 6, wherein said first compression means comprises at least one threaded bolt extending from said first clamping plate to said second clamping plate and at least one threaded nut receiving said threaded bolt.

8. The cooling apparatus according to claim 1, wherein the heatpipe/electronic modules further comprise a key portion for preventing incorrect ordering and orientation of said plurality of heatpipe/electronic modules within said compact electronic system.

9. The cooling apparatus according to claim 1, wherein the heatpipe/electronic modules further comprise an arrangement for providing address designations for said electronic circuit modules.

10. In a compact electronic system having a plurality of electronic circuit modules including a multiplicity of electronic circuit elements, a method for cooling said electronic circuit modules comprising the steps of:
   providing a plurality of self contained substantially isothermal heatpipe elements;
   integrally joining at least one of said electronic circuit modules to each of said heatpipe elements, said heatpipe elements and electronic circuit modules when integrally joined forming a plurality of heatpipe/electronic modules;
   electrically interconnecting said electronic circuit modules; and,
   stacking said heatpipe/electronic modules successively wherein each element of each of said heatpipe/electronic modules vertically touches said heatpipe of an adjacent heatpipe/electronic module so as to form a mechanical and electrical contact.

11. The method according to claim 10, wherein said providing heatpipes further comprises providing thin-walled hollow bodies containing high vapor pressure liquid.

12. The cooling apparatus as set forth in claim 11, wherein providing said heatpipes further comprises the steps of:
   providing substantially rectangular plates having top, bottom, front and back surfaces,
   providing further a substantially centrally located recesed portion on the top surface of said plate,
   extending said recessed portion in a first dimension from said front surface to said back surface of said rectangular plate,
   conformally receiving said electronic circuit module within said recessed portion in a second dimension, said electronic circuit modules extending beyond said front and back surfaces in said first dimension, and said bottom surface comprising a bottom heat transfer interface, and
   providing a pair of lateral surfaces comprising lateral heat transfer interfaces on said top surface abutting said recessed portion and symmetrically extending away therefrom in said second dimension in a plane substantially parallel with said recessed portion, said lateral heat transfer interfaces extending in said first dimension between said front and back surfaces of said rectangular plate.

13. The method according to claim 10, wherein providing said connector means further comprises the steps of:
   providing at least one high density multiple signal connector for intercoupling said electronic circuit modules, said high density multiple signal connectors further coupled to said electronic circuit elements mounted to each electronic circuit module, and
   providing at least one stacking connector interposed between said high density multiple signal connectors of adjacent electronic circuit modules for receiving and transmitting control and data signals between adjacent electronic circuit modules.

14. The method as set forth in claim 10, wherein providing said framework means further comprises the steps of:
   positioning a first clamping plate below a first heatpipe/electronic module;
   positioning a second clamping plate above a final heatpipe/electronic module, and
   providing compression means connected to and extending between said first and second clamping plates for urging said plates together.

15. The method as set forth in claim 14, wherein providing said compression means comprises providing at least one threaded bolt extending from said first clamping plate to said second clamping plate, and providing at least one threaded nut for receiving said threaded bolt.

16. The method according to claim 10 further comprising the step of providing a key portion for preventing incorrect ordering and orientation of said plurality of heatpipe/electronic modules within said compact electronic system.

17. The method according to claim 10 further comprising the step of providing an arrangement for providing address designations for said electronic circuit modules.

* * * * *

UNITED STATES PATENT AND TRADEMARK OFFICE
CERTIFICATE OF CORRECTION

PATENT NO. : 5,181,167
DATED : January 19, 1993
INVENTOR(S) : Davidson et al.

It is certified that error appears in the above-identified patent and that said Letters Patent is hereby corrected as shown below:

In column 9, claim 12 at line 11, please delete " recesed " and insert -- recessed --.

Signed and Sealed this

Eleventh Day of November, 1997

Attest:

BRUCE LEHMAN

*Attesting Officer*     *Commissioner of Patents and Trademarks*